(12) United States Patent
Kimura

(10) Patent No.: US 8,034,167 B2
(45) Date of Patent: Oct. 11, 2011

(54) BUFFER TANK, INTERMEDIATE ACCUMULATION APPARATUS, LIQUID TREATMENT APPARATUS, AND SUPPLYING METHOD OF TREATING LIQUID

(75) Inventor: Yoshio Kimura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1091 days.

(21) Appl. No.: 11/889,464

(22) Filed: Aug. 13, 2007

(65) Prior Publication Data

US 2008/0041465 A1 Feb. 21, 2008

(30) Foreign Application Priority Data

Aug. 15, 2006 (JP) ................................. 2006-221667
Jul. 31, 2007 (JP) ................................. 2007-199427

(51) Int. Cl.
*B01D 19/00* (2006.01)
*B01D 35/00* (2006.01)

(52) U.S. Cl. .................. 95/259; 95/24; 96/157; 96/219; 210/436; 210/472

(58) Field of Classification Search ................. 137/544, 137/558; 95/24, 241, 259, 266; 96/155, 96/157, 193, 219; 210/436, 472
See application file for complete search history.

(56) References Cited

U.S. PATENT DOCUMENTS

| 5,256,171 | A | * | 10/1993 | Payne ................................ 95/24 |
| 6,193,783 | B1 | | 2/2001 | Sakamoto et al. |
| 6,402,821 | B1 | * | 6/2002 | Matsuyama ...................... 96/193 |
| 6,578,772 | B2 | | 6/2003 | Fujimoto et al. |
| 7,594,801 | B2 | * | 9/2009 | Udagawa ......................... 95/241 |
| 7,635,410 | B2 | * | 12/2009 | Park et al. ........................ 95/259 |

FOREIGN PATENT DOCUMENTS

| JP | 01189304 A | * | 7/1989 |
| JP | 02040208 A | * | 2/1990 |
| JP | 05115704 A | * | 5/1993 |
| JP | 2000-12449 | | 1/2000 |
| WO | WO 01/95995 A2 | * | 12/2001 |

* cited by examiner

*Primary Examiner* — John Rivell
(74) *Attorney, Agent, or Firm* — Smith, Gambrell & Russell, LLP

(57) ABSTRACT

A buffer tank for use in a liquid treatment apparatus applying a liquid treatment to a substrate surface by supplying thereto a treating liquid from a nozzle, the buffer tank is provided in a flow path of the treating liquid from a supply tank of the liquid to the nozzle, the buffer tank including an inlet port for introducing the treating liquid supplied from the supply tank into a buffer tank body, a first accumulation region in the buffer tank body for holding the treating liquid introduced into the buffer tank, a first vent port for discharging bubbles accumulated in the first accumulation region, a filter through which the treating liquid in the first accumulation region passes, the filter filtering the treating liquid, and a supplying port for supplying the treating liquid filtered with the filter to the nozzle.

15 Claims, 12 Drawing Sheets

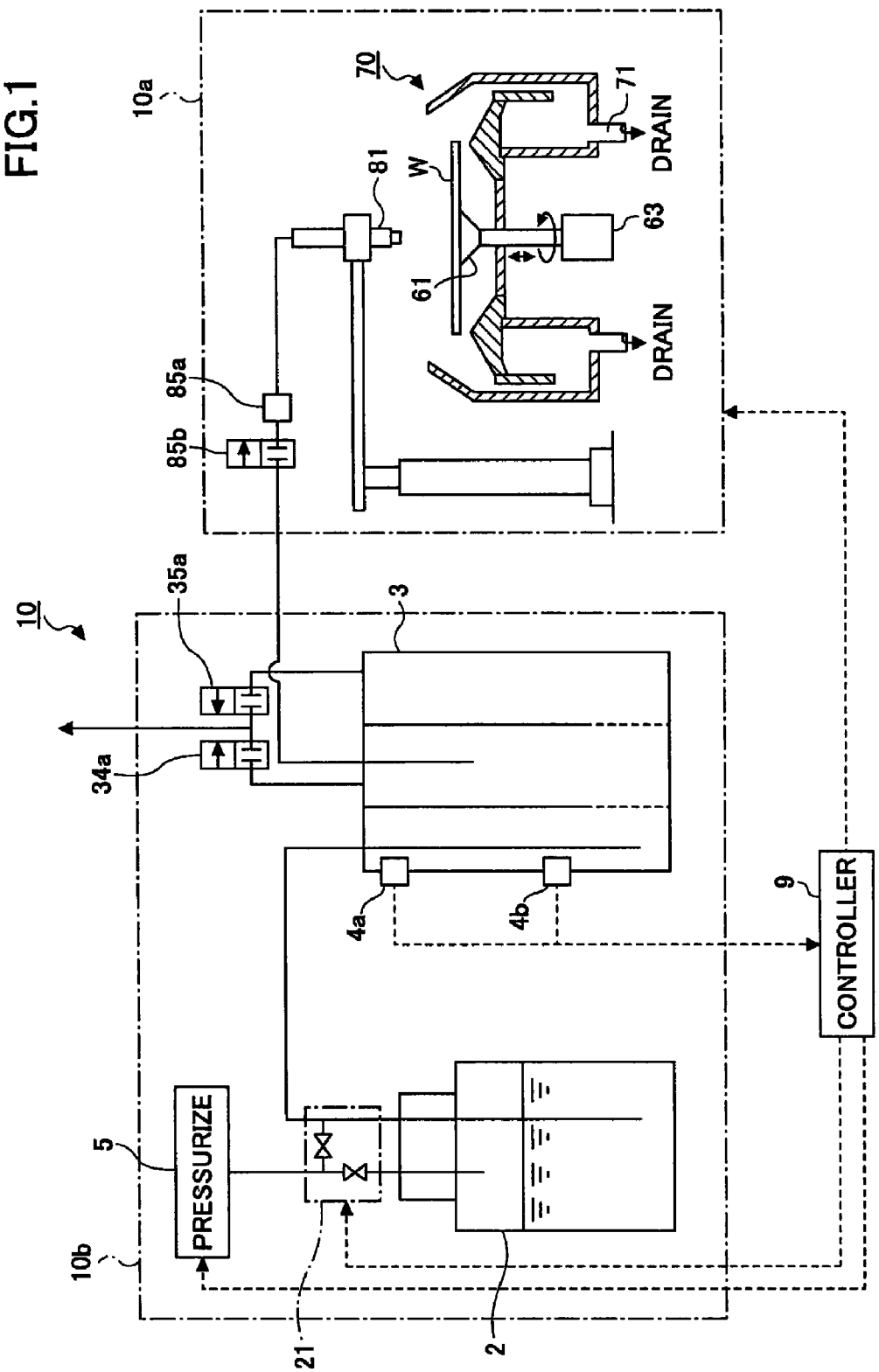

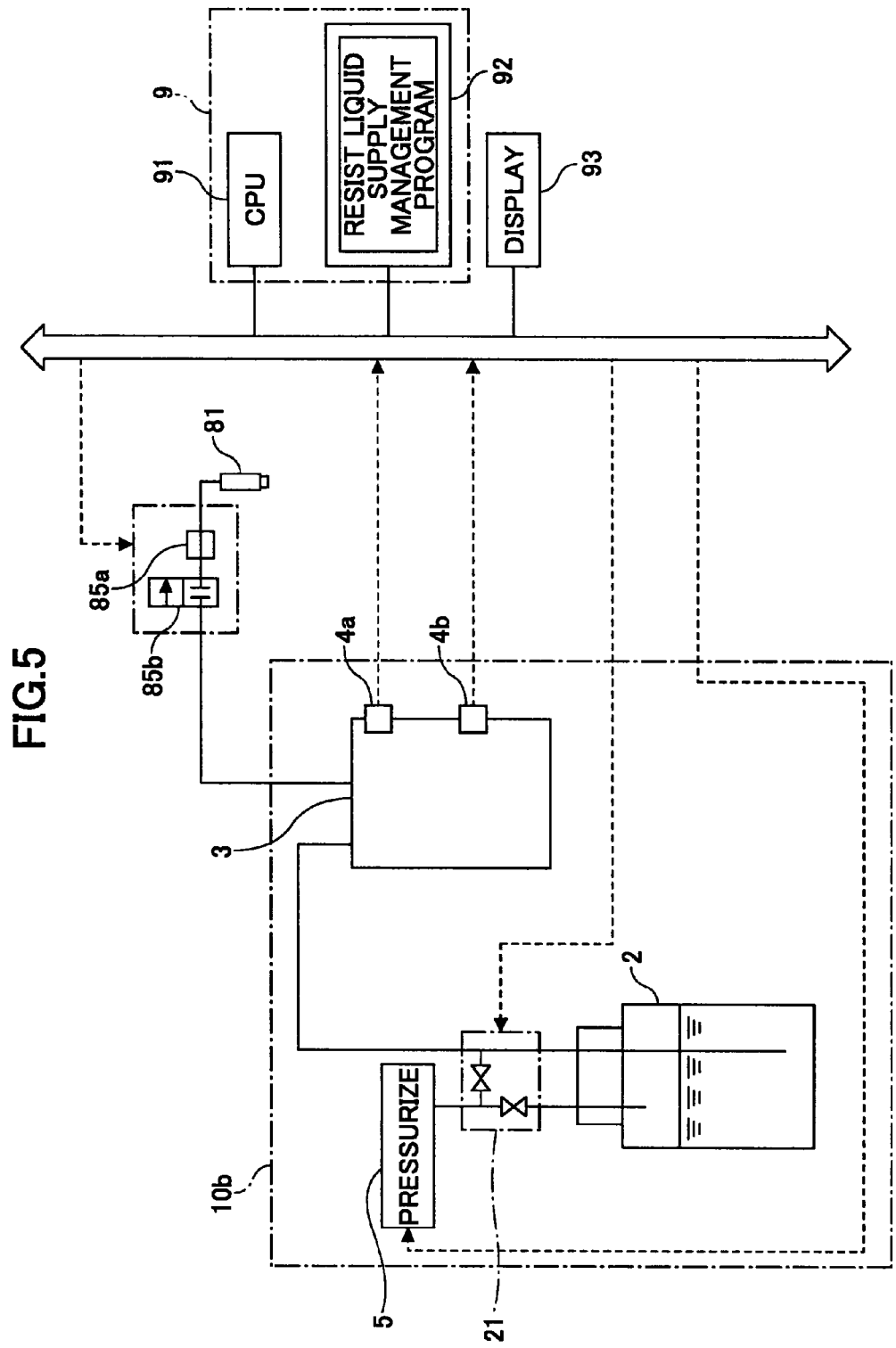

BUFFER TANK, INTERMEDIATE ACCUMULATION APPARATUS, LIQUID TREATMENT APPARATUS, AND SUPPLYING METHOD OF TREATING LIQUID

BACKGROUND OF THE INVENTION

The present invention relates to the technology of supplying treating liquid to liquid treatment apparatus that applies a treating liquid such as a resist liquid upon a substrate, such as a semiconductor wafer or a glass substrate (LCD substrate) of liquid crystal display devices.

In the fabrication process of semiconductor devices, there is used an apparatus that applies a liquid treatment process to a surface of a semiconductor wafer (referred to hereinafter simply as "wafer") by supplying thereto a treating liquid. Such liquid treatment process includes a treatment that uses a resist liquid as the treating liquid, a treatment that uses a developing liquid as the treating liquid, a treatment that uses a solution containing precursor of insulation film as the treating liquid, and the like.

In an example shown in FIG. 12, such a liquid treatment process is carried out in a liquid treatment apparatus 100 equipped with a liquid treatment unit 110a. In the liquid treatment unit 110a, a wafer W is held horizontally on a spin chuck 106 inside a cup 108 and the liquid treatment is carried out by ejecting a treating liquid from a supply nozzle 109 while rotating the wafer W by a drive mechanism 107.

Supply of the treating liquid to this liquid treatment unit 110a is achieved by using a supply unit 110b provided inside the liquid treatment apparatus 100. The supply unit 110b includes a supply tank 101 holding the treating liquid therein, a remaining amount detection tank 102, a filter 103 for eliminating impurities and bubbles in the treating liquid, a second trap 104 for eliminating bubbles passed through the filter 103 from the treating liquid, valves 102a-104a for discharging the bubbles from the vents provided thereto, and liquid feeding means to be explained below, wherein the supply tank 101, the remaining amount detection tank 102, the filter 103, the second trap 104, the valves 102a-104a, and the liquid feeding means are connected with each other by conduits. The liquid feeding means includes an air-operated valve 111b and a suck valve 111a and is capable of supplying the treating liquid to the supply nozzle 109 with a constant amount. Further, there is provided a pressurizing part 105 pressurizing the interior of the supply tank for pumping out the treating liquid.

As set forth in Patent Reference 1, the residual amount detection tank 102 detects, when the treating liquid inside the supply tank 101 has been used up and use of the treating liquid in the residual amount detection tank 102 has been started, that the supply tank 101 has been emptied and that the use of the treating liquid in the remaining amount detection tank 102 been has started by way of a liquid level sensor (not shown) provided to the remaining amount detection tank 102, and notifies this to operator.

On the other hand, the liquid treatment apparatus 100 of such a conventional construction is complex in that there are provided various parts such as the remaining amount detection tank 102, the filter 103, the second trap 104, and the like, in the manner that they are connected with each other by the conduits, while such a complex construction raises the problem of poor efficiency of maintenance work and high risk of causing liquid leakage for example at the joints used for connecting various parts to the conduits. Further, because the supply unit 110b includes a number of parts as noted above, there has been a difficulty of downsizing the coating and developing apparatus and reducing the space occupied by the coating and developing apparatus in which the liquid supplying apparatus 100 is used.

It should be noted that Patent Reference 1 discloses the technology of ensuring removal of bubbles in the resist liquid by applying a negative pressure to the resist liquid as it flows through a path in the supplying unit 110b such that the gases dissolved into the resist liquid are removed in the form of bubbles. Thus, this technology of Patent Reference 1 addresses a problem different from the problem of reducing the space occupied by the liquid treatment apparatus as in the case of the present invention.

Patent Reference 1 Japanese Laid-Open Patent Application 2000-12449

SUMMARY OF THE INVENTION

The present invention has been made under these circumstances and it is an object of the present invention to provide a buffer tank of compact size, capable of providing improved work efficiency and capable of reducing troubles such as leakage of liquid, as well as an intermediate accumulation apparatus and a liquid treatment processing apparatus in which such a buffer tank is used. Further, the present invention provides a supplying method of treating liquid conducted by using such a buffer tank.

In a first aspect, the present invention provides a buffer tank for use in a liquid treatment apparatus applying a liquid treatment to a substrate surface by supplying thereto a treating liquid from a nozzle, said buffer tank being provided in a flow path of said treating liquid from a supply tank of said liquid to said nozzle, said buffer tank comprising:

an inlet port for introducing said treating liquid supplied from said supply tank into a buffer tank body;

a first accumulation region in said buffer tank body for holding said treating liquid introduced into said buffer tank body;

a first vent port for discharging bubbles accumulated in said first accumulation region;

a filter causing said treating liquid in said first accumulation region to pass therethrough, said filter filtering said treating liquid; and a supplying port for supplying said treating liquid filtered with said filter to said nozzle.

In a preferred embodiment, the buffer tank further comprises a compartment member dividing an inner space inside said buffer tank body into said first accumulation region and further a second accumulation region, said filter being provided in a part of said compartment member so as to provide a flow path of said treating liquid from said first accumulation region to said second accumulation region.

In a preferred embodiment, the buffer tank further comprises, in said second accumulation region, a gas/liquid separation part configured to separate bubbles passed through said filter from said treating liquid by using a difference of specific gravity between said treating liquid and said bubbles, and a second vent port for discharging said bubbles separated in said gas/liquid separation part.

In a preferred embodiment, the buffer tank further comprises a compartment wall dividing said second accumulation region into a first region at a side of said filter and a second region at a side where an opening of said supply port is provided, said compartment wall being provided such that said treating liquid passed through said filter flows into said opening of said supply port after overriding a top edge of said compartment wall.

In a preferred embodiment, said compartment member comprises a cylindrical body provided such that a bottom surface thereof is located above a bottom surface of said buffer tank body and such that said filter constitutes a lower part of said cylindrical body, and wherein said inlet port is connected to a flow path introducing said treating liquid to a region underside of said bottom surface of said cylindrical member.

In a preferred embodiment, said buffer tank body comprises an upper vessel part accommodating an upper part of said cylindrical body and a lower vessel part accommodating said filter forming said lower part of said cylindrical body, said upper vessel part and said lower vessel part being coupled with each other in a detachable manner.

In a preferred embodiment, said inlet port and said supply port are provided on a top surface of said buffer tank.

In a second aspect, the present invention provides an intermediate accumulation apparatus for use in a liquid treatment apparatus applying a liquid treatment to a substrate surface by supplying thereto a treating liquid from a nozzle, comprising:

a buffer tank provided in a flow path of said treating liquid from a supply tank of said liquid to said nozzle, said buffer tank comprising: an inlet port for introducing said treating liquid supplied from said supply tank into a buffer tank body; a first accumulation region in said buffer tank body for holding said treating liquid introduced into said buffer tank body; a first vent port for discharging bubbles accumulated in said first accumulation region; a filter causing said treating liquid in said first accumulation region to pass therethrough, said filter filtering said treating liquid; a supplying port for supplying said treating liquid filtered with said filter to said nozzle; and a detection unit detecting a liquid level in said first accumulation region for notifying when said supply tank has become empty.

In a preferred embodiment, said detection unit is provided to a lateral side of said buffer tank in a detachable manner.

In a preferred embodiment, the intermediate accumulation apparatus further comprises a fixing unit fixing said buffer tank, said buffer tank being provided with said inlet port and said supply port on a top surface thereof, such that said fixing unit comprises a joint member connected to and disconnected from said inlet port and said supply port with a single operation of said fixing unit.

In a preferred embodiment, the intermediate accumulation unit further comprises an additional detection unit detecting a lower limit level of said treating liquid in said supply tank for notifying that supply of said treating liquid to the supply nozzle should be stopped, said detection unit and said additional detection unit being provided to said fixing unit.

In a third aspect, the present invention provides an intermediate accumulation apparatus for use in a liquid treatment apparatus applying a liquid treatment to a substrate surface by supplying thereto a treating liquid from a nozzle, comprising:

a buffer tank provided in a flow path of said treating liquid from a supply tank of said liquid to said nozzle, said buffer tank comprising: an inlet port for introducing said treating liquid supplied from said supply tank into a buffer tank body; a first accumulation region in said buffer tank body for holding said treating liquid introduced into said buffer tank body; a first vent port for discharging bubbles accumulated in said first accumulation region; a filter causing said treating liquid in said first accumulation region to pass therethrough, said filter filtering said treating liquid; a supplying port for supplying said treating liquid filtered with said filter to said nozzle; and a detection unit detecting a lower limit level of said treating liquid in said first accumulation region, said lower limit level being set at a level above a level of said filter in said first accumulation region, said detection unit notifying when said level of said treating liquid has become equal to or lower than said lower limit level for stopping supply of said treating liquid to the supply nozzle.

In a preferred embodiment, said detection unit is provided to a lateral side of said buffer tank in a detachable manner.

In a fourth aspect, the present invention provides a liquid treatment apparatus treating a surface of a substrate held generally horizontally on a stage by supplying a treating liquid to said surface from a supply nozzle, comprising:

a supply tank supplying said treating liquid; and an intermediate accumulation apparatus provided in feed path of said treating liquid from said supply tank to said supply nozzle, said intermediate accumulation apparatus comprising:

a buffer tank provided in said flow path of said treating liquid from said supply tank of said liquid to said nozzle, said buffer tank comprising: an inlet port for introducing said treating liquid supplied from said supply tank into a buffer tank body; a first accumulation region in said buffer tank body for holding said treating liquid introduced into said buffer tank body; a first vent port for discharging bubbles accumulated in said first accumulation region; a filter causing said treating liquid in said first accumulation region to pass therethrough, said filter filtering said treating liquid; a supplying port for supplying said treating liquid filtered with said filter to said nozzle; and a first detection unit detecting a liquid level in said first accumulation region for notifying when said supply tank has become empty.

In a fifth aspect, the present invention provides a method for supplying a treating liquid, in a liquid treatment apparatus that treats a substrate with said treating liquid by supplying said treating liquid to a surface of said substrate from a supply nozzle, such that said treating liquid is supplied from a supply tank to said supply nozzle, comprising the steps of:

introducing said treating liquid from said supply tank into a buffer tank body;

holding said treating liquid introduced into said buffer tank in a first accumulation region inside said buffer tank body;

discharging bubbles accumulated in said first accumulation region via a first vent port;

filtering said treating liquid in said first accumulation region by a filter; and supplying said treating liquid filtered with said filter to said nozzle from a supplying port.

In a preferred embodiment, the method further comprises, before said step of supplying said treating liquid from said supply port to said supply nozzle, the steps of: causing to flow said treating liquid filtered with said filter to a second accumulation region, said second accumulation region being provided in said buffer tank body with separation from said first accumulation region by a compartment member; separating bubbles passed through said filter with a gas-liquid separation part provided in said second accumulation region by using a difference of specific gravity between said treating liquid and said bubbles; and discharging said bubbles from a second vent port provided in said second accumulation region.

In a preferred embodiment, the method further comprises a step of notifying that said supply tank has become empty by detecting a liquid level in said first accumulation region when replacing said supply tank.

In a preferred embodiment, the method further comprises a step of monitoring whether or not said liquid level in said buffer tank has reached a lower limit level for stopping supply of said treating liquid to said supply nozzle, said lower limit level being set above a level of said filter in said first accumulation region.

According to the present invention, the filter is integrated to the buffer tank used for supplying the treating liquid in the supply tank to the liquid treatment apparatus. Thus, the piping work at the time of replacing the supply tank is simplified substantially as compared with the case of constructing the buffer tank and the filter in the form of separate members because of reduced numbers of components to be assembled to the liquid treatment apparatus. Further, it becomes possible to reduce the size of the components to be incorporated into the liquid treatment apparatus as compared with the case of the conventional liquid treatment apparatuses, and thus, it becomes possible to reduce the space occupied by the liquid treatment apparatus and reduce the cost for the liquid treatment apparatus.

Other objects and further features of the present invention will become apparent from the following detailed description when read in conjunction with the attached drawings.

BRIEF DESCRIPTION OF THE DRAWINGS

FIG. 1 is a diagram showing the construction of a liquid treatment apparatus according to an embodiment of the present invention;

FIG. 5 is a block diagram showing the electric construction of the liquid treatment apparatus;

DETAILED DESCRIPTION OF THE PREFERRED EMBODIMENTS

Figure 2B:
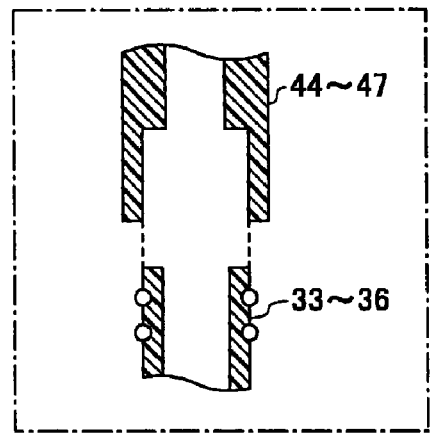
FIGS. 2A and 2B are diagrams showing the buffer tank according to the embodiment of FIG. 1 of the present invention together with a fixing unit thereof.

Hereinafter, the present invention will be described for the case of a coating apparatus coating a resist liquid as a treating liquid upon a wafer used for a substrate by a spin coating process.

FIG. 1 shows the construction of a liquid treatment apparatus 10.

Referring to FIG. 1, the liquid treatment apparatus 10 includes a liquid treatment unit 10a carrying out a spin coating process of the resist liquid upon a wafer W and a supply unit 10b supplying the resist liquid to the liquid treatment unit 10a.

As explained in relation to the background art of the present invention, the liquid treatment unit 10a includes a cup 70 accommodating therein a spin chuck 61 for holding the wafer W generally horizontally, wherein the spin chuck 61 is rotated and moved up and down by a drive mechanism 63. Further, there is provided a drain exit 71 at a bottom part of the cup 70 for discharging excessive resist liquid not coated upon the wafer W in the form of drain or mist.

Further, there is provided a supply nozzle 81 at the central part of the wafer W held on the spin chuck 61 for ejecting the resist liquid in the state that the supply nozzle 81 is held by a base or arm. It should be noted that the supply nozzle 81 is formed with a minute ejection opening connected to the supply unit 10b via an air-operated valve 85b and a suck back valve 85a. The suck back valve 85a has a suction chamber formed with a diaphragm, for example, and pulls back the tip end surface of the resist liquid from the tip end of the supply nozzle 81 by inducing a negative pressure in the suction chamber by way of expanding the diaphragm with a vacuum pressure, or the like, when the resist liquid is not to be ejected.

Next, details of the supply unit 10b will be described. The supply unit 10b includes a supply tank 2 holding the resist liquid to be supplied to the liquid treatment unit 10a and a detachable buffer tank 3 for holding the resist liquid in the feed path of the resist liquid from the supply tank 2 to the supply nozzle 81. The supply tank 2 is connected to the pressurizing part 5, wherein the pressurizing part 5 works to feed the resist liquid in the supply tank 2 toward the liquid treatment unit 10a by supplying a gas and pressurizing the interior of the supply tank 2.

Further, there is provided a switching valve 21 between the pressurizing part 5 and the supply tank 2, and thus, it is possible to switch the destination of the gas supplied from the pressurizing part 5 between the supply tank 2 and the buffer tank 3.

The buffer tank 3 is disposed in the feed path of the resist liquid from the supply tank 2 to the suck back valve 85a. As will be explained later, the buffer tank 3 is equipped with two vents for discharging the bubbles separated from the resist liquid in the buffer tank 3. As shown in FIG. 1, the buffer tank 3 is provided with valves 34a and 35b, wherein these valves are used to open the vents to the outside at the time of discharging the bubbles from the buffer tank 3. Further, it can be seen that there are provided two sensors 4a and 4b at the sidewall of the buffer tank 3 for detecting the liquid level of the resist liquid held in the buffer tank 3 from outside. Thereby, the sensor 4a is provided in correspondence to the first detection unit for detecting that the resist liquid held in the supply tank 2 is used up and use of the resist liquid held in the buffer tank 3 is started. Further, the sensor 4b is an empty sensor of the treating liquid corresponding to the second detection unit detecting the liquid level of the resist liquid below which supply of the liquid from the buffer tank 3 is not possible.

Further, the liquid treatment apparatus 10 includes a controller 9 connected to various parts of the liquid treatment apparatus 10 and controls the operation of the liquid treatment apparatus 10.

Figure 2A:
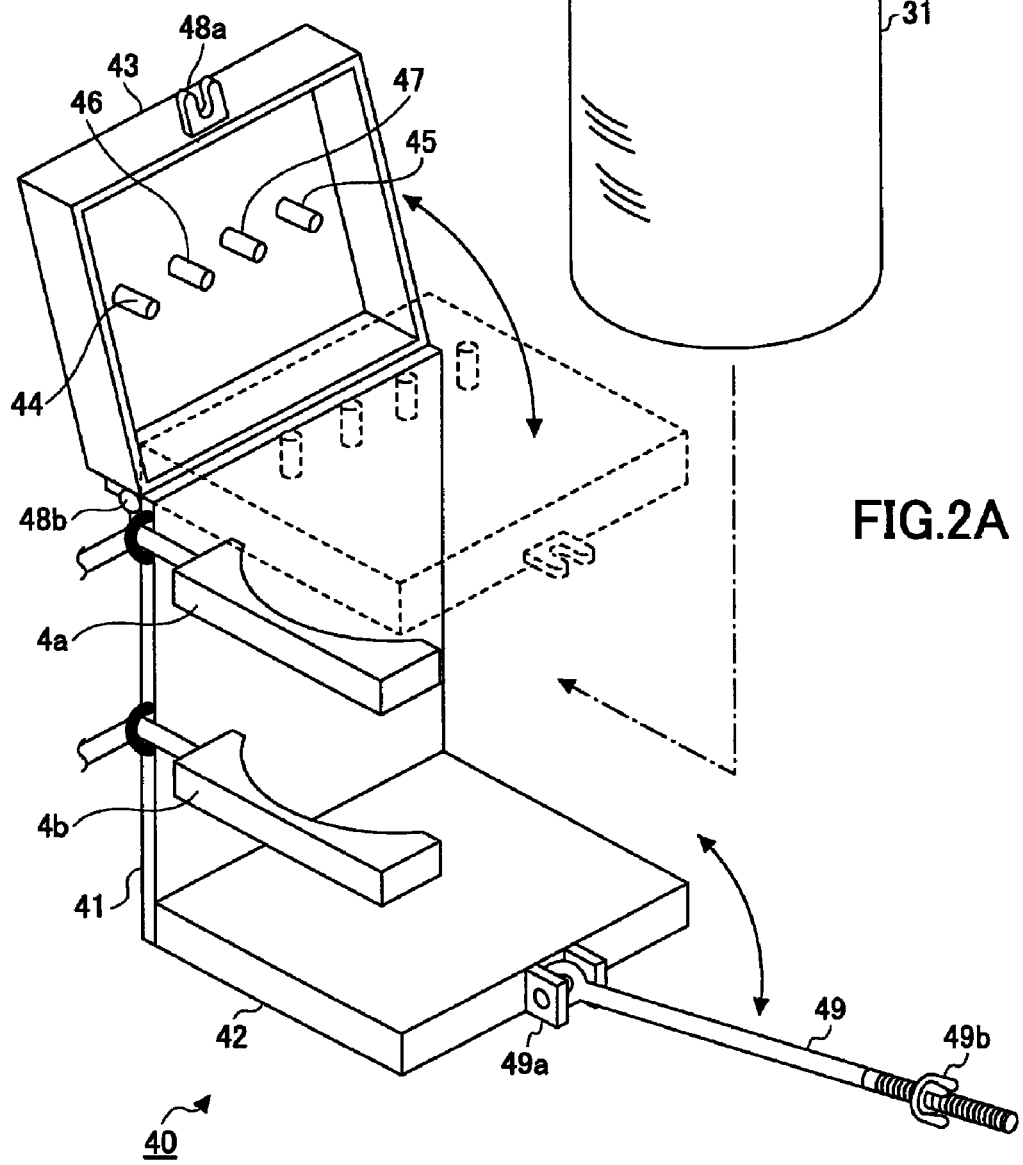

Next, the construction of the buffer tank 3 will be described in detail with reference to FIG. 2A, wherein FIG. 2A is an oblique view diagram representing the external view of the buffer tank 3 and the fixing unit 40 used for fixing the buffer tank 3.

Referring to FIG. 2A, the buffer tank 2 has a cylindrical structure, for example, wherein a buffer tank vessel 31 constituting the body of the buffer tank 3 is configured in the form disposable cartridge. Thus, the buffer tank vessel 31 can be disconnected from the liquid treatment apparatus 10 and discarded after use thereof. For example, the buffer tank vessel 31 is formed of a transparent or semi-transparent resin material such as Teflon (registered trademark), polyethylene, polypropylene, and the like, and thus, it is possible to detect the surface level of the resist liquid held therein from outside by way of optical means.

Further, there are provided four tube members 33-36 on a top surface of the buffer tank 31, wherein the tube members 33-36 constitute the connection port of the buffer tank 3. There, the tube member 33 functions as an inlet port for introducing the resist liquid pumped from the supply tank 2 into the buffer tank 3, the tube members 34 and 35 function as vent ports for discharging the bubbles accumulated in the buffer tank 3, and the tube member 36 functions as the supply port for supplying the resist liquid in the buffer tank 3 toward the liquid treatment unit 10a.

Preferably, the tube members 33-36 are disposed to avoid linear alignment for avoiding improper connection. For example, the tube members 34 and 35 may be disposed to offset from a line AA' in FIG. 4B connecting the tube member 33 for the inlet port and the tube member 36 for the supply port.

Next, the construction of the fixing unit 40 will be described.

Referring to FIG. 2A, the fixing unit 40 has a construction of providing a bottom plate 42 and a top plate 43 respectively at a top part and a bottom part of a side plate 41. Thereby, the top plate 43 is provided rotatably on the side plate 41 by way of a hinge 48b as represented in FIG. 2. On the other hand, the bottom plate 42 is provided with a fixing rod 49 at a free end part thereof away from the part connected to the side plate 41, wherein the fixing rod 49 is used for holding the buffer tank 3 between the top plate 43 and the bottom plate 42.

More specifically, an end of the fixing rod 49 is connected to the bottom plate 42 via a first fixing member 49a and is movable in the direction shown in FIG. 2. Further, the fixing rod 49 is threaded at the other end thereof, and thus, the fixing rod 49 is held firmly by a second fixing member 48a by screwing a butterfly nut 49b upon the treaded part of the fixing rod 49 in the state that the buffer tank 3 is held between the bottom plate 42 and the top plate 43. Of course, it is possible to hold the buffer tank 3 between the top plate 43 and the bottom plate 42 by sliding the top plate 43 up and down rather than rotating the same as shown in FIG. 2A.

Further, it should be noted that the top plate 43 is provided with joints of tubes 44-47 respectively in correspondence to the tube members 33-36, wherein the tube 44 is used for an inlet line of the treating liquid, the tube 45 is used for a primary vent line, the tube 46 is used for a secondary vent line, and the tube 47 is used for the supply line of the treating liquid to the liquid treatment unit 10a.

As shown in FIG. 2B, each of the tube members 33-36 of the buffer tank 3 is fitted with double seal rings O at a tip end part thereof, and thus, it is possible to cause the joint parts of the lines 44-47 to make air tight engagement with the corresponding tube members 33-36 by merely pressing down the top plate 43. Further, it is possible to disconnect the tubes 44-47 respectively from the tube members 33-36 by merely rotating up the top plate 43 in the upward direction.

Further, as shown in FIG. 2A, the fixing unit 40 is provided with the remaining amount sensor 4a and the empty sensor 4b in the form of a reflection type photosensor, for example, wherein the sensor 4a is provided in correspondence to the liquid level indicating that consumption of the resist liquid in the buffer tank 3 has been started while the sensor 4b is provided in correspondence to the liquid level in which there is no resist liquid capable of being supplied from the buffer tank 3 to the liquid treatment unit 10a. It should be noted that each of the photosensors 4a and 4b includes a light emitting device such as a laser diode not illustrated and a light receiving device such as a photodiode and detects whether the liquid surface is above or below the line connecting the light emission device and the light receiving device based on the signal level of the light emitted from the light emitting device and received by the light receiving device.

Figure 3:
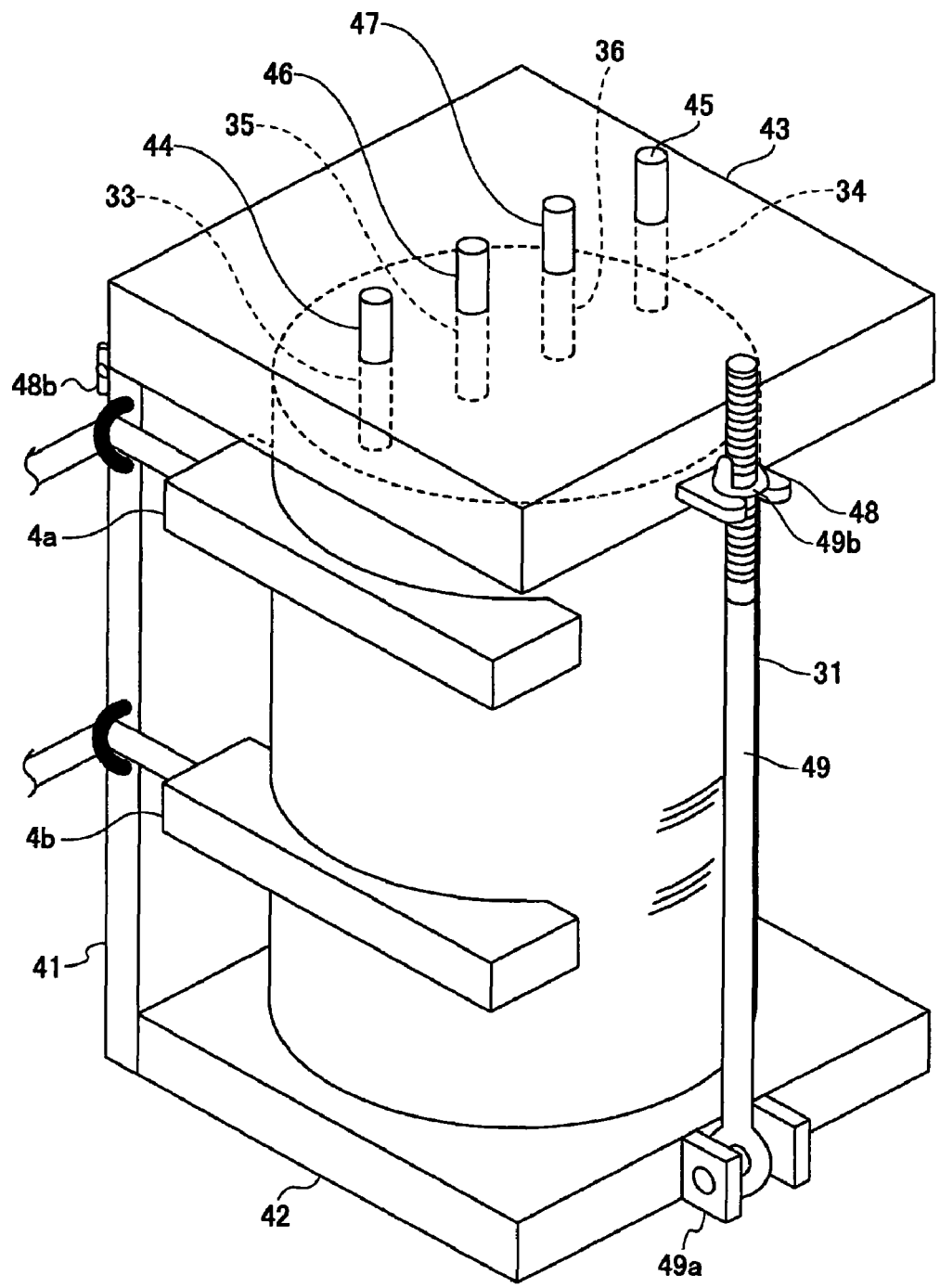
FIG. 3 is an oblique view diagram showing the buffer tank in the state the buffer tank is fixed upon the fixing unit.

FIG. 3 shows the buffer tank 3 in the state that the buffer tank 3 is held between the top plate 43 and the bottom plate 42 and the fixing rod 49 is used to urge the top plate 43 firmly upon the buffer tank 3. In this state, it can be seen that the lines 44-47 of the liquid treatment apparatus 10 are connected to the tube members 33-36, respectively, and with this, the buffer tank 3 is connected to the supply unit 10b. Further, it will be noted from FIG. 3 that it is possible to detect the liquid level by using the remaining liquid sensor 4a and the empty sensor 4b even when the buffer tank 3 is replaced with a new one.

Figure 4A:
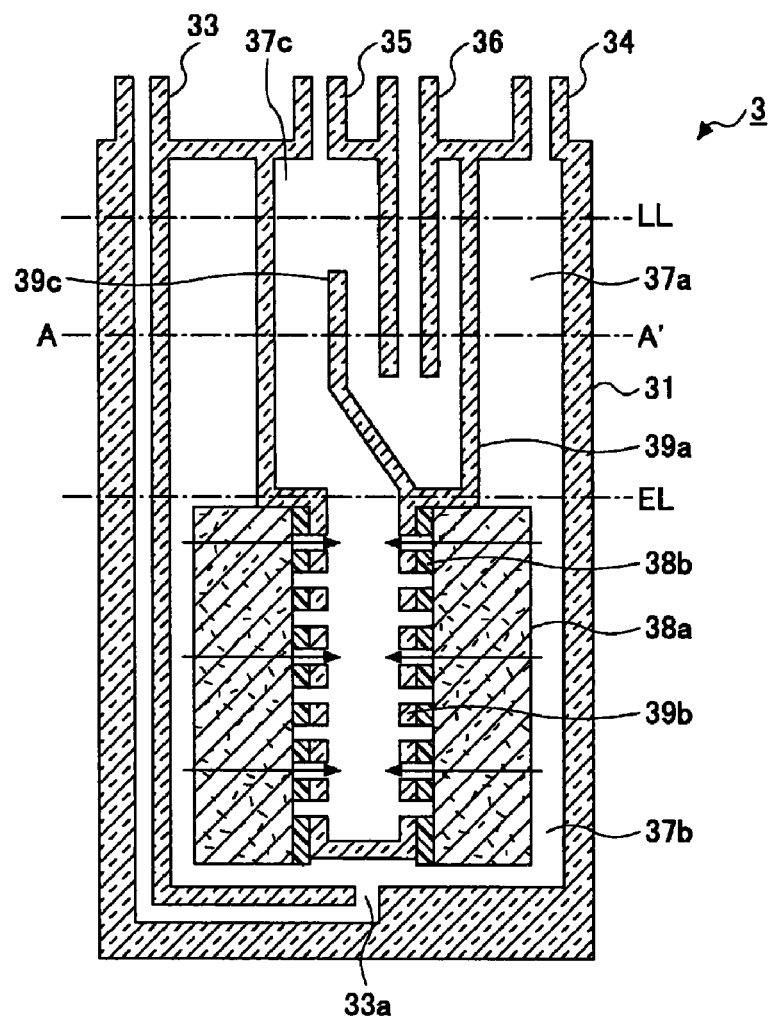
FIGS. 4A and 4B are respectively an elevational cross-sectional diagram and a transverse cross-sectional diagram showing an internal structure of the buffer tank.

FIG. 4A shows the buffer tank 3 in an elevational cross-sectional view. It should be noted that the buffer tank 3 of the present embodiment has the function of holding the resist liquid and further the function of removing impurities and bubbles from the resist liquid supplied from the supply tank 2. Hereinafter, internal structure of the buffer tank 3 for realizing these functions will be explained.

Referring to FIG. 4A, the interior of the buffer tank 3 is divided into an outer region and an inner region by a compartment 39 having a cylindrical shape, wherein the compartment 39 is provided in the buffer tank 3 at a level above the bottom surface of the buffer tank vessel 31. Further, the outer region of the compartment 39a is divided into an upper space region and a lower space region at a boundary corresponding to the liquid surface level detected by the empty sensor 4b.

There, the upper space region forms an accumulation part 37a functioning as the first accumulation region holding therein the resist liquid. On the other hand, the lower space part of the outer region of the compartment 39a forms a filter accommodation part 37b accommodating a filter 38a used for filtering the resist liquid supplied from the supply tank 2. Further, the inner region of the compartment 39a forms a second accumulation region in which the resist liquid filtered by the filter 38a is caused to flow. In FIG. 4A, the one-dotted line designated as LL (Limit Level) represents the level of the liquid detected by the remaining liquid sensor 4a, while the one-dotted line designated as EL (Empty Level) represents the level of the liquid detected by the empty sensor 4b.

Figure 4B:
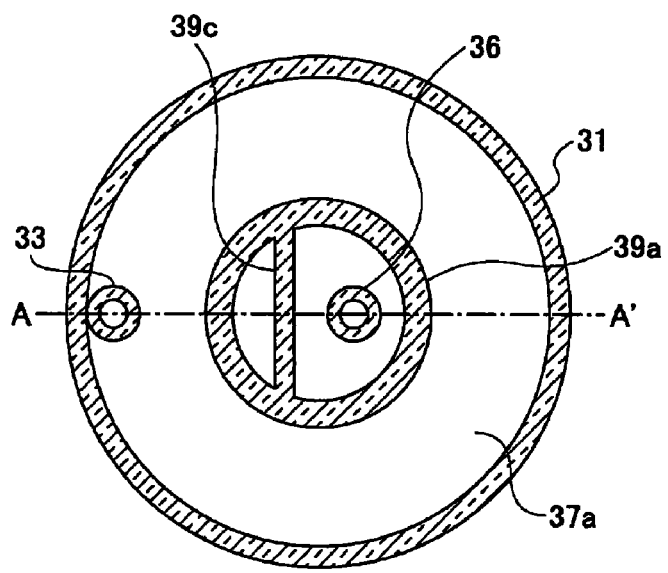

As shown in FIG. 4B showing the buffer tank 3 in a transverse cross-sectional view, the accumulation part 37a is a space formed in a double cylindrical structure and is defined by the cylindrical buffer tank vessel 31 and the inner compartment wall 39a of cylindrical form fixed upon the buffer tank vessel 31 in a generally concentric relationship. Thereby, the accumulation part 37a has a volume sufficient for accumulating the resist liquid consumed by the liquid treatment apparatus 10 during the processing the wafers W of one lot (the number of wafers accommodated in a carrier C1 to be explained later, for example) in the coating and developing apparatus.

The filter 38a is formed of a membrane filter constituting the filtering part and functions to remove impurities and bubbles in the resist liquid supplied from the supply tank 2.

The filter 38a has a cylindrical shape formed with a large number of penetrating holes and is fixed upon a resin filter core 38b provided for holding the filter 38a. Further, the lower half part of the compartment 39a forms a cylindrical liquid passage part 39b formed with a large number of penetrating holes and adapted to be mounted with the filter core 38b from outside. Further, by accommodating the filter 38a into the filter accommodation part 37a in the state that the liquid passage part 39b is inserted into the cylindrical member forming the filter core 38b, the filter 38a provides the passage for the treating liquid flowing from the accumulation part 37a to the gas-liquid separation part 37c.

In FIG. 4A, it should be noted that the level "EL" is set at a level higher than the level of the filter 38a, wherein this construction is adopted to avoid contact of the filer 38a with air even in the case the level of the treating liquid in the accumulation part 37a has been lowered to the lower limit. When the filter 38a is exposed to the air and the air has penetrated into the filter member, it becomes no longer possible to take out the filter 38a from the liquid passage part. Further, the level "LL" is set so that commencement of use of the resist liquid held in the accumulation part 37a is detected immediately.

It should be noted that the inlet port 33 provided to the top surface of the buffer tank 31 is connected to a flow passage extending downward in the buffer tank vessel 31 wherein the flow passage supplies the treating liquid from an inlet opening 33a formed generally at the central part of the buffer tank vessel 31 near the bottom surface thereof. The inlet opening 33a is formed underneath the bottom surface of the cylindrical liquid passage part 39b (compartment 39a) and it becomes possible to realizing uniform liquid flow in the buffer tank vessel 31.

Further, the space in the filter accommodation part 37b outside the filter 38a communicates with the accumulation part 37a, and it is possible to hold a predetermined amount of resist liquid in this accumulation part 37a. Further, the accumulation part 37a is formed with the primary vent port 34 at a ceiling part thereof, wherein the bubbles not passing through the filter 38a are collected to the ceiling part because of the difference of specific gravity. Thereby, the bubbles are discharged to the outside of the buffer tank vessel 31 via the primary vent port part 34.

Next, the gas-liquid separation part 37c will be described. The gas-liquid separation part 37c forms a second accumulation part formed in the compartment 38a and serves for the space for causing the resist liquid passed through the filter 38a. Thereby, the supply port 36 for supplying the resist liquid to the destination unit is provided to the central part of the gas-liquid separation part 37c and there extends a tube from the supply port 36 in the downward direction into the space inside the gas-liquid separation part 37c.

Further, as shown in the drawing, there is provided a compartment wall 39c for dividing the interior of the gas-liquid separation part 37c into a region at the side of the filter 38a and a region at the side where the opening (supply port opening) of the foregoing tube extending from the supply port 36 is formed. Thereby, the treating liquid passed through the filter 38a flows into the supply port opening of the supply port 36 after overriding the top edge of the compartment wall 39c.

With such a construction, it becomes possible to extract the resist liquid to the supply port 36 after separating the bubbles by utilizing the difference of specific gravity, without causing the resist liquid including therein tiny bubbles passed through the filter 38a into the supply port 36 directly. Further, the secondary vent port 35 is provided to the ceiling part of the gas-liquid separation part 37c for discharging the bubbles accumulated to the ceiling part as a result of assembling of the tiny bubbles to the outside of the buffer tank vessel 31.

Next, the construction and function of the control part 9 will be described.

FIG. 5 is a block diagram explaining the construction of the controller 9 and the relationship between the controller 9 and various parts of the liquid treatment apparatus 10.

Referring to FIG. 5, the controller 9 is formed of a computer having the function of controlling the overall operation of the coating and developing apparatus including the liquid treatment apparatus 10 used therein. Thus, the controller 9 includes a central processing unit (CPU) 91 and a program storage part 92.

With regard to the function of the present embodiment, the program storage part 92 plays the role of storing a computer program (designated as "resist liquid supply management program" in FIG. 5), wherein the computer program includes various steps for supplying the resist liquid to the wafer W while operating various devices in the supply unit 10b, the suck back valve 85a, and the like. It should be noted that the program storage unit 92 is formed of storage means such as a hard disk drive, a compact disk drive, a magneto-optical disk device, a memory card, and the like.

Further, the controller 9 is connected to the remaining liquid sensor 4a, the empty sensor 4a, the pressurizing part 5, the switch valve 21 and the suck back valve 85a, wherein the controller 9 acquires detection signals indicative of the resist liquid surface level from the sensors 4a and 4b and causes operation in the pressurizing part 5, the switch valve 21, the air operated valve 85b and the suck back valve 85a in response to the detected liquid surface level (and thus the amount of the resist liquid in the accumulation part 37a) for causing operations therein such as switching of the resist liquid source from the supply tank 2 to the buffer tank 3, stopping of supply of the resist liquid, or the like.

Further, a display part 93 is connected to the controller 9 wherein the display part 93 plays the role of displaying guidance to the operator in response to the result of detection of the sensors 4a and 4b.

Figure 6A:
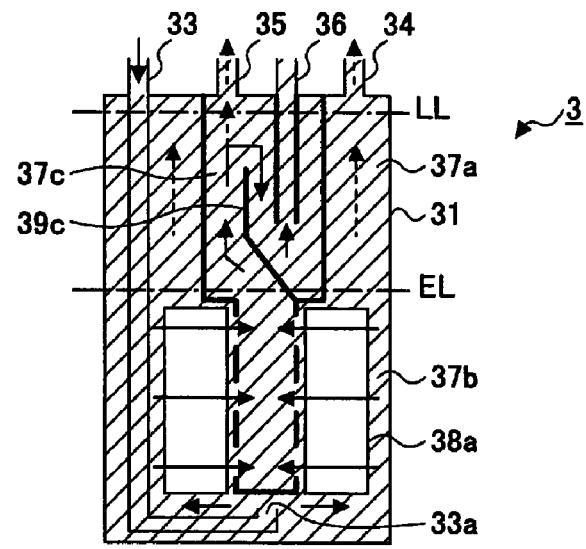
FIG. 6A-6C are diagrams for explaining the function of the buffer tank.
Figure 6B:
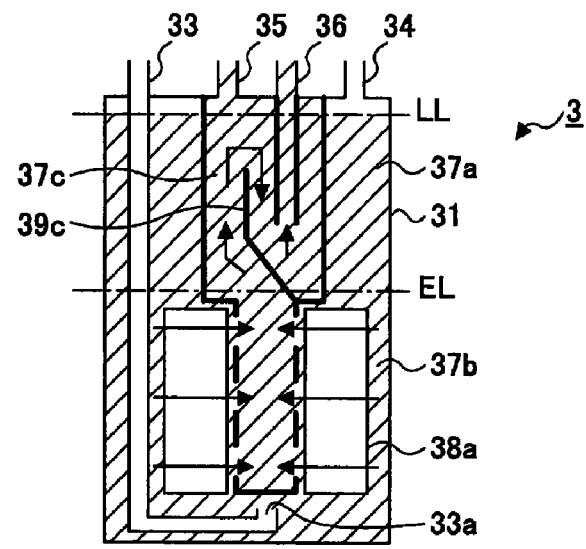
Figure 6C:
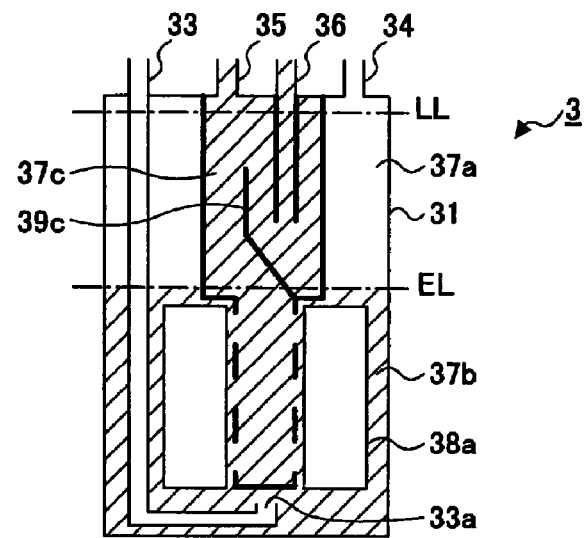

Next, operation of the buffer tank 3 of the present embodiment will be described with reference to FIGS. 6A-6C showing the interior of the buffer tank 3 for various remaining amounts of the resist liquid. In the drawings, the part provided with hatching represents that the part is filled with the resist liquid. Further, the solid lines in the drawings represent the flow of the resist liquid while the arrows represented by broken line represent the flow of bubbles included in the resist liquid.

First, normal operational state of the buffer tank 3 will be explained in which the resist liquid is supplied to the liquid treatment unit 10a from the supply tank 2 with reference to FIG. 6A.

Referring to FIG. 6A, the resist liquid supplied from the supply tank 2 is introduced into the bottom part of the filter accommodation part 37b from the inlet opening 33a through the inlet port 33 and is dispersed uniformly therein as shown with the arrows of continuous line shown in the vicinity of the inlet opening 33a before being introduced into the filter 38a. Here, the accumulation region 37a functioning as the first accumulation region is filled with the resist liquid, wherein there is held the resist liquid with the amount corresponding to the amount consumed during the period of processing the wafer W of one lot in the accumulation part 37a. In the beginning, pumping of the liquid is made in the state the vent valves 34a and 35b are opened, wherein the vent valves 34a and 34b are closed when the resist liquid has flooded from the first vent port 34 and the second vent port 35.

The resist liquid thus supplied to the buffer tank vessel 31 is caused to flow to the gas-liquid separation part 37c functioning as the second accumulation region through the filter 38a as shown in FIG. 6A in the state in which impurities or bubbles are removed by the filter 38a. There, the bubbles not passed through the filter 38a cause migration in the upward direction through the accumulation part 37a as represented by the arrows of broken lines shown in the accumulation part 37a. Thus, by opening the vent valve 35a shown in FIG. 1 as necessary, the resist liquid containing the bubbled accumulated to the ceiling part of the accumulation part 37a is discharged to the outside of the buffer tank vessel 31.

On the other hand, the resist liquid entered into the gas-liquid separation part 37c flows in the upward direction along the compartment wall 39c and then goes downward after overriding the top edge of the compartment wall 39c, wherein the resist liquid flows further into the supply port opening formed at the bottom of the tube extending downward from the supply port 36. By forming such a flow of the treating liquid in the gas liquid separation part 37c, it becomes possible to prevent the resist liquid containing bubbles from flowing into the supply port of the resist liquid even in the case a part of the bubbles contained in the resist liquid has passed through the filter 38a. Further, as shown by the arrows of broken line in the gas-liquid separation part 37c of FIG. 6A, the bubbles are separated from the resist liquid and cause migration in the upward direction. Thereby, the bubbles colleted in the ceiling part are discharged to the outside by opening the vent port 35 as necessary.

Next, the case where the resist liquid supplied from the supply tank 2 is used up will be explained. When the resist liquid in the supply tank 2 is used up, the gas supplied from the pressurizing part 5 is started to be supplied to the buffer tank 31 from the inlet port 33 through the supply path of the resist liquid. With this gas pressure, the resist liquid held in the accumulation part 37a is pushed out and supply of the resist liquid to the liquid treatment unit 10a is started while using the resist liquid thus accumulated in the accumulation part 37a.

With commencement of consumption of the resist liquid in the accumulation part 37a, there is formed a liquid surface of the resist liquid in the accumulation part 37a and when the level of this liquid surface has reached the level "LL" as showing in FIG. 6B, this lowering of the liquid surface is detected by the remaining liquid sensor 4a. Thus, based on this detection result, an alarm is notified, with the liquid treatment apparatus 10, to the operator indicating that the liquid in the supply tank 2 is used up by displaying an alarm screen in the display part 93 and the switch valve 21 is switched such that the gas in the pressurizing part 5 is supplied directly to the buffer tank 3. With this, the emptied supply tank 2 becomes the state ready for replacement with a new tank.

Further, the liquid treatment apparatus 10 is kept operating until the supply tank 2 is replaced with a new tank by the operator while using the resist liquid held in the accumulation part 37a. When the liquid treatment apparatus 10 is kept operating but without replacing the supply tank 2, the level of the resist liquid eventually reaches the level "EL" as represented in FIG. 6C in due course, wherein this state of resist liquid is detected by the empty sensor 4b. Then the supply of the gas from the pressurizing part 5 is stopped with the liquid treatment apparatus 10 based on the result of detection, and supply of the resist liquid to the liquid treatment unit 10a from the supply unit 10b is stopped by activating the air operated valve 85b and the such back valve 85a.

According the present invention, the following advantageous effects are attained.

Figure 12:
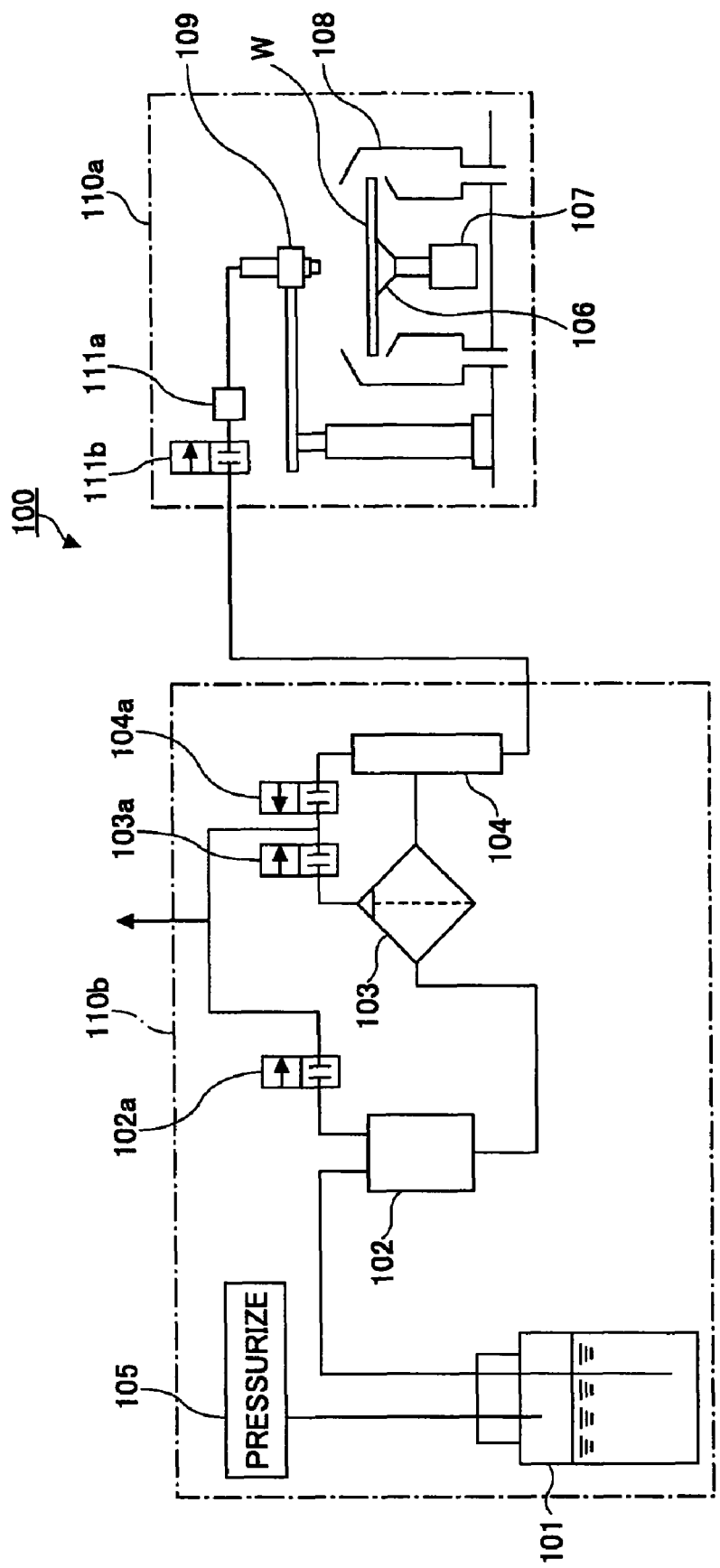
FIG. 12 is a diagram showing a conventional construction of liquid treatment apparatus.

Because of the construction of providing the filter 38a used for removing impurities, exotic materials or bubbles, from the resist liquid supplied from the supply tank 2, inside the buffer tank 3, there is no longer the need of connecting the tank and filter by conduits and joints, as in the case of the conventional construction shown in FIG. 12 in which the remaining amount detection tank 102 and the filter 103 are formed by separate devices, and the connection work of the conduits becomes much easier. Further, the size of the liquid supply unit used in the liquid treatment apparatus can be reduced. As a result, work efficiency is improved and the space occupied by the liquid treatment apparatus 10 is reduced. Further, the cost for the liquid treatment apparatus 10 is also reduced. Further, by providing the gas-liquid separation part 37c for separating the bubbles passed through the filter 38a by the difference of specific gravity between the treating liquid and the bubble at the secondary side of the filter 38a and further providing the secondary vent port 35 for discharging the bubbles thus separated by the gas-liquid separation part 37c, there is no longer the need of providing the secondary trap 104 (see FIG. 12) used in the conventional apparatus, and the saving of space occupied by the liquid treatment apparatus is attained. Further, reduction of the cost of the liquid treatment apparatus is attained.

Further, because it is possible with the present invention to reduce the number of joints used for connecting the conduits to various devices of the liquid supply unit by integrating the functions conventionally performed by three distinct devices into a single buffer tank 3, the risk of causing leakage of liquid from the joints is decreased with the present invention. Further, because it is possible to reduce the number of the vents for discharging the bubbles from three in the conventional case, in which a vents is provided to each of the devices, to two with the present invention, it is possible to reduce the amount of the treating liquid flooded from the vents together with the bubbles at the time of deaeration process. Thereby, the running cost of the liquid treatment apparatus is reduced.

Further, because the liquid treatment apparatus is equipped with the joints to the conduits on the top surface of the buffer tank vessel 31 at the outer side, the work for connecting and disconnecting the buffer tank 3 to and from the liquid treatment apparatus 10 becomes much easier as compared with the conventional construction. Further, loss of the liquid by leakage is suppressed minimum as compared with a hypothetical case of providing such joints on the bottom surface of the buffer tank vessel 31.

Further, because the liquid treatment apparatus 10 is equipped with the sensors 4a and 4b for detecting the amount of the liquid held in the buffer tank 3, it is possible to notify the running out of the liquid in the supply tank or stopping of supply of the resist liquid by using the result of detection obtained by the sensors 4a and 4b.

It should be noted that the liquid amount sensor applicable to the present invention is not limited to the one described in the foregoing example. For example, it is possible to mount the sensors 4a and 4b for detecting the liquid level of the resist liquid directly upon the lateral side of the buffer tank vessel 31. Further, the sensors 4a and 4b are not limited to the optical sensors but the sensor that detects the change of electrostatic capacitance between electrodes may also by used. Further, a sensor of the type detecting the liquid level by inserting a probe into the buffer tank may also be used.

Figure 7:
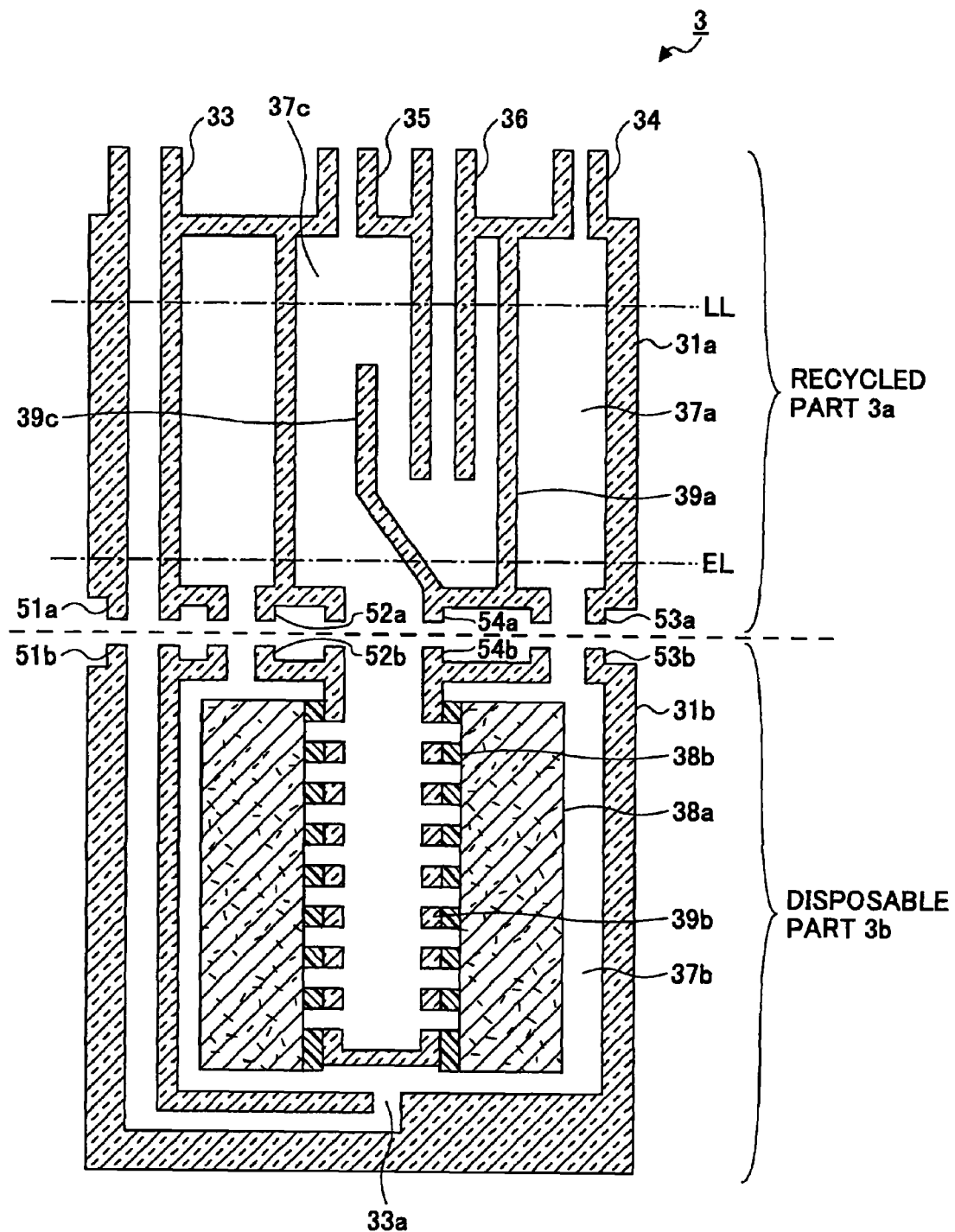
FIG. 7 is an elevational cross-sectional diagram showing a modification of the buffer tank.

Further, as shown in FIG. 7, it is possible to divide the buffer tank vessel 31 into an upper vessel part 31a accommodating therein the upper part (compartment 39a) of the cylindrical body and a lower vessel part 31*b* accommodating therein the filter 38*a*, such that the upper vessel part 31*a* forms a recycled part 3*a* used repeatedly while the lower vessel part 31*b* forms a disposable part dismounted and discarded after the use thereof. Here, connection of the upper vessel part 31*a* and the lower vessel part 31*b* is achieved at an intermediate location of the flow path of the resist liquid extending from the inlet port 33 to the inlet opening 33*a* (inlet flow path connection parts 51*a*, 51*b*), at a boundary between the accumulation part 37*a* and the filter accommodation part 37*b* (outer cylinder connection parts 52*a*-53*a*, 52*b*-53*b*), and at the boundary between the compartment 39*a* and the liquid passage part 39*b*. While the elevational cross-section of FIG. 7 shows only the two outer cylinder connection parts 52*a*-53*a* and 52*b*-53*b* respectively at the right and left in the sheet of the drawing, there may be provided three or more outer cylinder connection parts along the circumferential direction at the boundary between the accumulation part 37*a* and the filter accommodation part 37*b*.

Figure 8A:
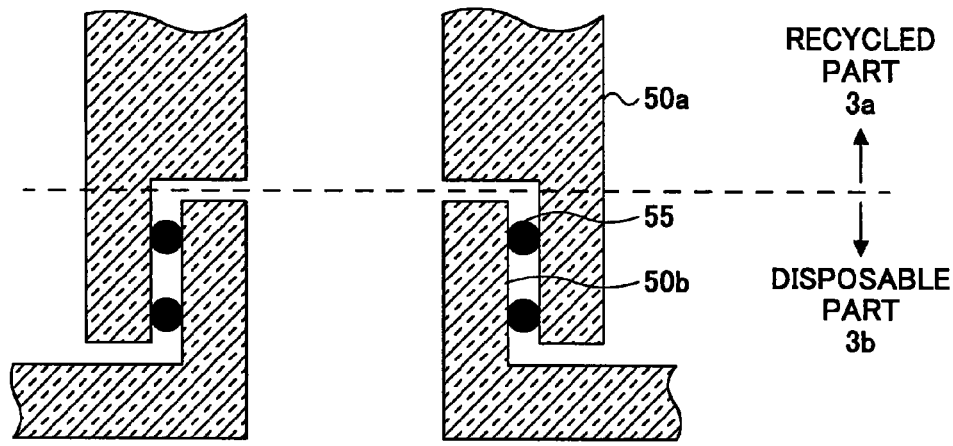
FIGS. 8A and 8B are elevational cross-sectional diagrams showing a connection part of an upper vessel and a lower vessel in the modification of FIG. 7.
Figure 8B:
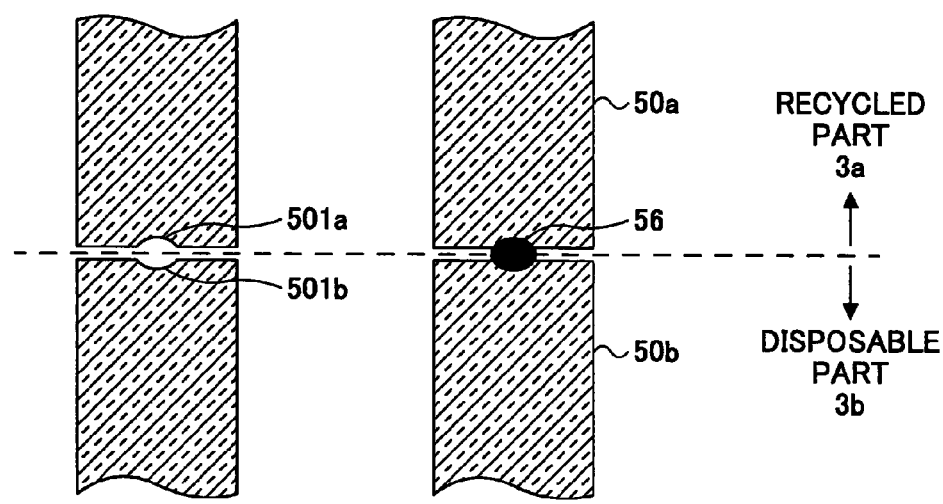

Thereby, the connection parts 51*a*-54*a* and 51*b*-54*b* (referred to hereinafter with the numeral 50*a* and 50*b* respectively) may be formed such that the connection part 50*b* of the lower vessel part 31*b* is inserted into the connection part 50*a* of the upper vessel part 31*a* as shown in FIG. 8A in the manner that the gap between the connection part 50*a* and the connection part 50*b* is sealed with a seal ring 55. Alternatively, as shown in FIG. 8B, it is possible to form grooves 501*a* and 501*b* respectively on the lower surface of the connection part 50*a* and the upper surface of the connection part 50*b* and urge the upper vessel 31*a* and the lower vessel 31*b* with each other by using the top plate 43 and the bottom plate 42 shown in FIGS. 2 and 3 in the state that a seal ring 56 is fitted to the grooves 501*a* and 501*b*, such that the connection part 50*a* and 50*b* are fixed with each other in tight engagement. In FIG. 8B, the seal ring 56 is represented only on the connection parts 50*a* and 50*b* at the right side for the sake of convenience of representing the grooves 501*a* and 501*b*.

When replacing the buffer tank 3, the entire buffer tank 3 is dismounted from the fixing unit 40, and the buffer tank 3 thus dismounted is decomposed into the recycled part 3*a* and the disposable part 3*b*. Further, the recycled part 3*a* is cleaned for reuse while the disposable part 3*b* is replaced with a new disposable part 3*b*. When there are provided a plurality of recycled parts 3*a* ready for use, it is possible to mount the buffer tank 3 again upon the fixing unit 40 without waiting for completion of the cleaning and subsequent drying of the dismounted recycled part 3*a*. According to the present embodiment, the number of the disposable parts is reduced as compared with the case in which the buffer tank vessel 31 is formed in a unitary body, and thus, the present embodiment is effective for reducing cost and saving resources. Further, each of the recycled part 3*a* and the disposable part 3*b* has an internal structure much simpler as compared with the case the recycled part 3*a* and the disposable part 3*b* form a unitary body, and the manufacturing process of the buffer tank 3 is simplified. Thereby, the cost of the buffer tank is reduced also.

Figure 9:
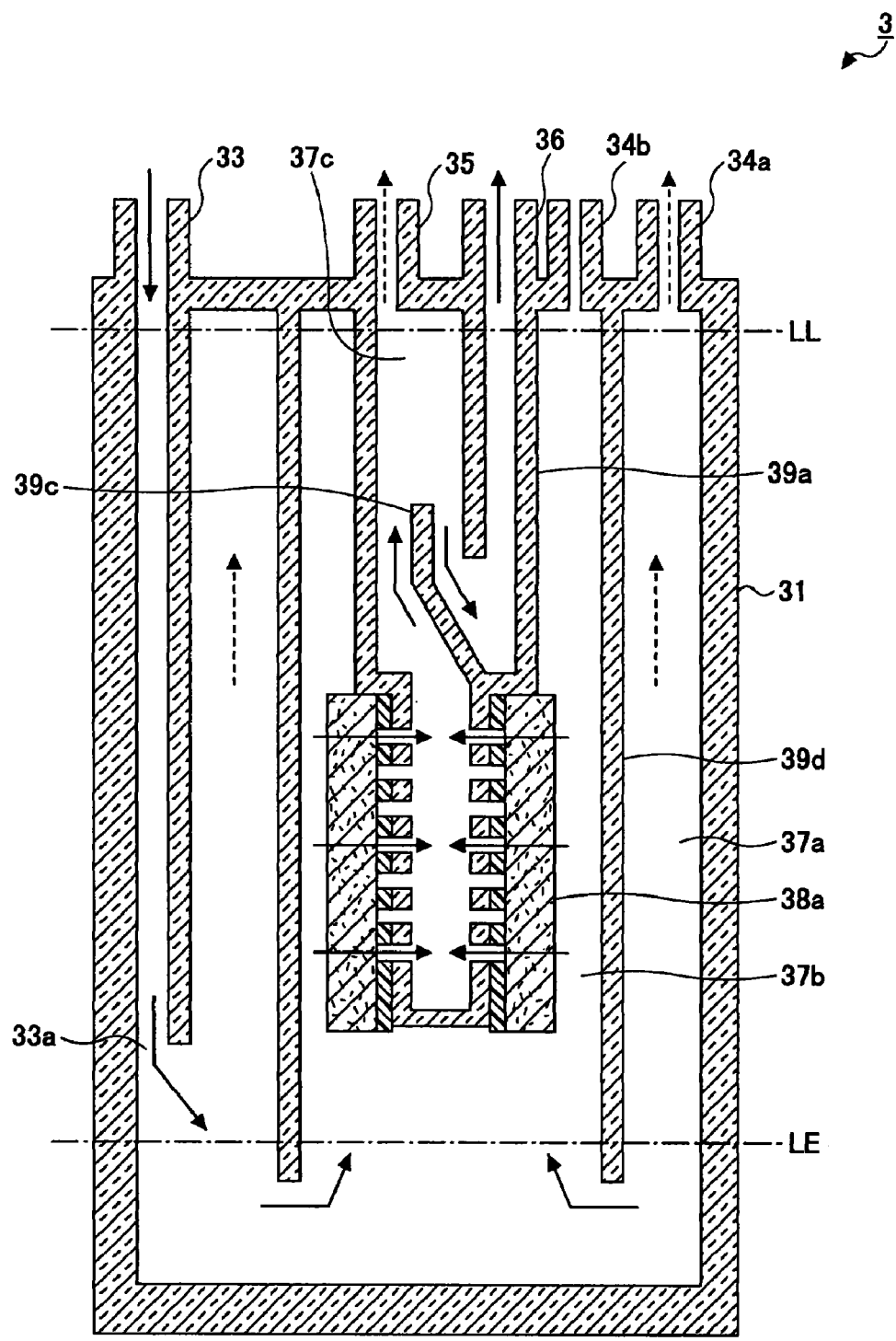
FIG. 9 is a longitudinal cross-sectional diagram of the buffer tank according to another embodiment.

It should be noted that the construction inside the buffer tank is by no means limited to those explained with reference to the previous embodiments. For example, it is possible to provide a second compartment 39*d* surrounding the filter 38*a* as shown in FIG. 9, such that the space formed between the second compartment 39*d* and the buffer tank vessel 31 serves for the accumulation part 37*a* used for the first accumulation region. With such a construction, it becomes possible to increase the volume of the accumulation part 37*a*, and thus, the duration in which the resist liquid can be supplied from the buffer tank 3 is increased. Thereby, a time margin is secured for the operation of replacing the supply tank 2. In the present case, it is preferable to add a second primary vent port 34*b* in addition to the primary vent port 34*a* for discharging the bubbles accumulated in the ceiling part between the compartment 39*b* and the second compartment 39*d*.

While the present invention has been explained for the liquid treatment apparatus 10 used for applying a resist liquid coating the wafer W with a resist liquid, it should be noted that the treating liquid applied upon the wafer W may for example be a liquid forming an anti-reflection coating or a liquid serving for the precursor of forming an interlayer insulation film on the wafer W such as an SOD (spin-on-dielectric) liquid or SOG (spin-on-glass) liquid. Further, the liquid treatment apparatus 10 can be applied to a developing apparatus applying developing to the substrate subjected to exposure process.

Figure 10:
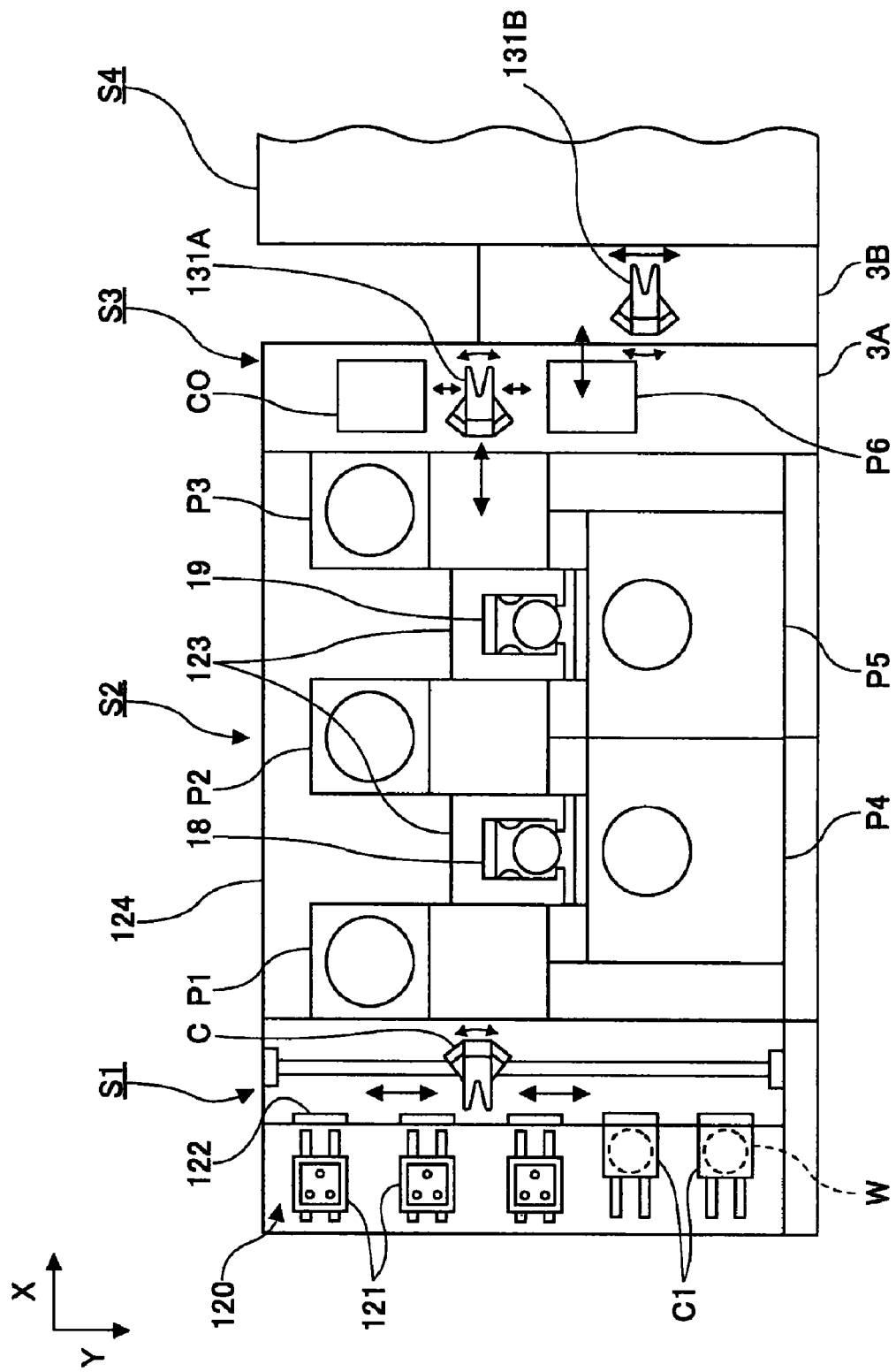
FIG. 10 is a plan view diagram showing a coating and developing apparatus to which a coating unit of the present invention is applied.
Figure 11:
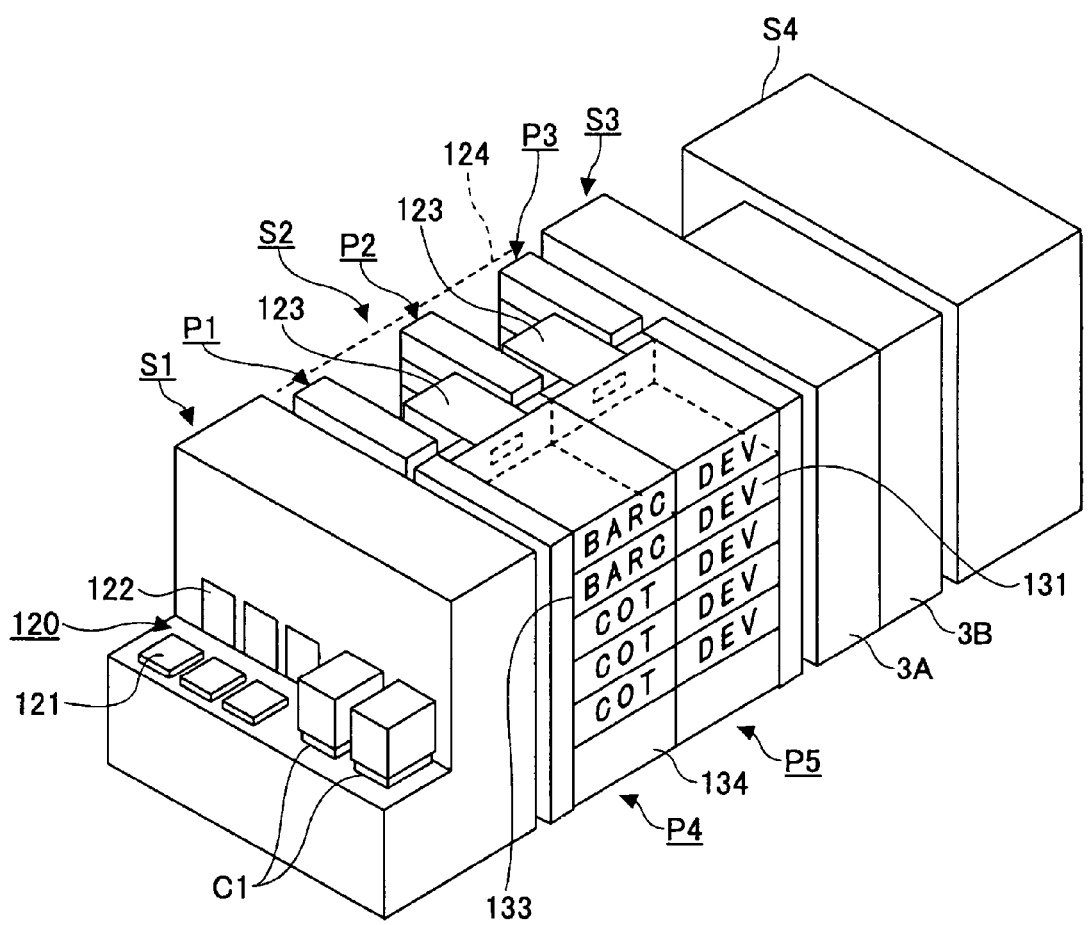
FIG. 11 is an oblique view diagram showing the coating and developing apparatus.

Next, an example of applying the liquid treatment apparatus 10 to a developing apparatus will be explained briefly. FIG. 10 is a plan view diagram showing a system in which an exposure apparatus is coupled to a developing apparatus, while FIG. 11 is an oblique view diagram of the system of FIG. 10. Referring to FIGS. 10 and 11, the system includes a carrier block S1, wherein the carrier block S1 includes therein a carrier station 120 equipped with a table 121 used for loading and unloading carriers C1 each holding thirteen wafers W, for example, in airtight state, an open/close door 122 provided in the front wall of the carrier station 120, and a transfer arm C for taking out the wafer W from the carrier C1 through the open/close door 122.

Behind the carrier block S1, there is connected a processing block S2 surrounded by a housing 124, wherein the processing block S2 includes, from the front side toward the rear side, rack units P1, P2 and P3, liquid treatment units P4 and P5, and transfer means (main arms) 18 and 19 in an alternate relationship, wherein each rack units P1, P2 and P3 have heating and cooling units tiered on multiple shelves. Thereby, the transfer means 18 and 19 plays the role of transferring wafers W between these units. The transfer means 18 and 19 are disposed in a space 123 defined by a side portion of the rack units P1, P2 and P3 disposed in a forward direction as viewed from the carrier block S1, a side portion of the liquid treatment units P4 and P5 disposed at the right side as viewed from the carrier block S1, and a partition wall disposed at the left side as viewed from the carrier block S1. Here, the liquid treatment units P4 and P5 are configured similarly to the liquid treatment unit explained in the previous embodiments of the present invention.

Each of the rack units P1, P2 and P3 has a construction of stacking various units for carrying out the pre-processing and post-processing for the process carried out in the liquid treatment units P4 and P5. Such processing unit forming the stack includes a plurality of heating units (PAB) for baking the wafer W and cooling units for cooling the wafer W.

The liquid treatment units P4 and P5 may include therein various units such as bottom anti-reflection coating (BARC) application unit 133, a resist application unit (COT) 134, a developing unit (DEV) 131, and the like, on a liquid holding part holding the resist liquid or developing liquid in the form of stack of multiple layers such as five layers. Here, it should be noted that the liquid holding part above accommodates therein the supply unit 10*b* explained with reference to the previous embodiments, and thus, the liquid treatment units P4 and P5 are connected to the respective supply units 10*b*.

Behind the processing block S2, there is provided an interface block S3 between the processing block S2 and an exposure block S4, wherein the interface block S3 is formed of a first transfer chamber 3A and a second transfer chamber 3B behind the first transfer chamber 3A. There, the first and second transfer chambers 3A and 3B include respectively wafer transfer mechanisms 131A and 131B in a manner movable up and down, rotatable about a vertical axis and movable forward and backward as desired.

Thereby, the first transfer chamber 3A is provided with a rack unit P6 and a buffer cassette CO. Further, the rack unit P6 has the construction of stacking, in vertical direction, the transfer stage (TRS) between the wafer transfer mechanism 131A and the wafer transfer mechanism 131B and a high precision temperature regulation unit including therein a heating unit (PEB) for heating the wafer after the exposure processing and a cooling plate.

Next, the flow of wafer processing conducted with the coating and developing apparatus of FIGS. 10 and 12. First a carrier C1 accommodating therein a wafer W is incorporated into the carrier block S1 from outside. There, the wafer W is transferred along the path of: transfer arm C→transfer unit (TRS) of the rack unit P1→transfer means 18→bottom antireflection coating (BARC) formation unit 133→transfer means 18 (19)→heating unit→transfer means 18 (19)→cooling unit hydrophobic processing unit→transfer means 18 (19)→cooling unit transfer means 18 (19)→resist coating unit (COT) 134→transfer means 18 (19)→heating unit→transfer means 18 (19)→cooling unit→transfer means 19→transfer unit (TRS) of rack unit P3→wafer transfer mechanism 131A→transfer unit (TRS) of rack unit P6 wafer transfer mechanism 131B→exposure unit S4.

After the exposure processing, the wafer W is transferred along the path of: wafer transfer mechanism 131B→transfer stage (TRS) of the rack unit P6→wafer transfer mechanism 131A→heating unit of rack unit P6→wafer transfer mechanism 131A temperature regulation unit of rack unit P6→wafer transfer mechanism 131A→transfer stage (TRS) of rack unit P3→transfer means 19→developing unit 131→transfer unit 18→transfer unit (TRS) of rack unit P1→transfer arm C. Further, the wafer W is returned to the carrier C1, and the coating and developing process is completed.

Further, the present invention is not limited to the embodiments described heretofore but various variations and modifications may be made without departing from the scope of the invention.

The present invention is based on Japanese patent applications 2006-221667 and 2007-199427 respectively filed on Aug. 15, 2006 and Jul. 31, 2007, the entire contents of which are incorporated herein as reference.

What is claimed is:

1. A buffer tank for use in a liquid treatment apparatus applying a liquid treatment to a substrate surface by supplying thereto a treating liquid from a nozzle, said buffer tank being provided in a flow path of said treating liquid from a supply tank of said liquid to said nozzle, said buffer tank comprising:
   an inlet port for introducing said treating liquid supplied from said supply tank into a buffer tank body;
   a first accumulation region in said buffer tank body for holding said treating liquid introduced into said buffer tank body;
   a first vent port for discharging bubbles accumulated in said first accumulation region;
   a filter causing said treating liquid in said first accumulation region to pass therethrough, said filter filtering said treating liquid;
   a supplying port for supplying said treating liquid filtered with said filter to said nozzle;
   a gas/liquid separation part configured to separate bubbles passed through said filter from said treating liquid by using a difference of specific gravity between said treating liquid and said bubbles;
   a second vent port for discharging said bubbles separated in said gas/liquid separation part; and
   a compartment member dividing an inner space inside said buffer tank body into said first accumulation region and further a second accumulation region,
   said filter being provided in a part of said compartment member so as to provide a flow path of said treating liquid from said first accumulation region to said second accumulation region.

2. The buffer tank as claimed in claim 1, further comprising a compartment wall dividing said second accumulation region into a first region at a side of said filter and a second region at a side where an opening of said supply port is provided, said compartment wall being provided such that said treating liquid passed through said filter flows into said opening of said supply port after overriding a top edge of said compartment wall.

3. The buffer tank as claimed in claim 1, wherein said compartment member comprises a cylindrical body provided such that a bottom surface thereof is located above a bottom surface of said buffer tank body and such that said filter constitutes a lower part of said cylindrical body, and wherein said inlet port is connected to a flow path introducing said treating liquid to a region underside of said bottom surface of said cylindrical member.

4. The buffer tank as claimed in claim 3, wherein said buffer tank body comprises an upper vessel part accommodating an upper part of said cylindrical body and a lower vessel part accommodating said filter forming said lower part of said cylindrical body, said upper vessel part and said lower vessel part being coupled with each other in a detachable manner.

5. The buffer tank as claimed in claim 1, wherein said inlet port and said supply port are provided on a top surface of said buffer tank.

6. An intermediate accumulation apparatus for use in a liquid treatment apparatus applying a liquid treatment to a substrate surface by supplying thereto a treating liquid from a nozzle, comprising:
   a buffer tank provided in a flow path of said treating liquid from a supply tank of said liquid to said nozzle, said buffer tank comprising:
   an inlet port for introducing said treating liquid supplied from said supply tank into a buffer tank body;
   a first accumulation region in said buffer tank body for holding said treating liquid introduced into said buffer tank body;
   a first vent port for discharging bubbles accumulated in said first accumulation region;
   a filter causing said treating liquid in said first accumulation region to pass therethrough, said filter filtering said treating liquid;
   a supplying port for supplying said treating liquid filtered with said filter to said nozzle;
   a gas/liquid separation part configured to separate bubbles passed through said filter from said treating liquid by using a difference of specific gravity between said treating liquid and said bubbles;
   a second vent port for discharging said bubbles separated in said gas/liquid separation part; and
   a compartment member dividing an inner space inside said buffer tank body into said first accumulation region and further a second accumulation region, said filter being provided in a part of said compartment member so as to provide a flow path of said treating liquid from said first accumulation region to said second accumulation region; and a detection unit detecting a liquid level in said first accumulation region for notifying when said supply tank has become empty.

7. The intermediate accumulation apparatus as claimed in claim 6, wherein said detection unit is provided to a lateral side of said buffer tank in a detachable manner.

8. The intermediate accumulation apparatus as claimed in claim 6, further comprising a fixing unit fixing said buffer tank, said buffer tank being provided with said inlet port and said supply port on a top surface thereof, such that said fixing unit comprises a joint member adapted to be connected to and disconnected from said inlet port and said supply port with a single operation of said fixing unit.

9. The intermediate accumulation unit as claimed in claim 8, further comprising an additional detection unit detecting a lower limit level of said treating liquid in said supply tank for notifying that supply of said treating liquid to the supply nozzle should be stopped, said detection unit and said additional detection unit being provided to said fixing unit.

10. An intermediate accumulation apparatus for use in a liquid treatment apparatus applying a liquid treatment to a substrate surface by supplying thereto a treating liquid from a nozzle, comprising:

a buffer tank provided in a flow path of said treating liquid from a supply tank of said liquid to said nozzle, said buffer tank comprising:

an inlet port for introducing said treating liquid supplied from said supply tank into a buffer tank body;

a first accumulation region in said buffer tank body for holding said treating liquid introduced into said buffer tank body;

a first vent port for discharging bubbles accumulated in said first accumulation region;

a filter causing said treating liquid in said first accumulation region to pass therethrough, said filter filtering said treating liquid;

a supplying port for supplying said treating liquid filtered with said filter to said nozzle; and a detection unit detecting a lower limit level of said treating liquid in said first accumulation region, said lower limit level being set at a level above a level of said filter in said first accumulation region, said detection unit notifying when said level of said treating liquid has become equal to or lower than said lower limit level for stopping supply of said treating liquid to the supply nozzle.

11. The intermediate accumulation apparatus as claimed in claim 10, wherein said detection unit is provided to a lateral side of said buffer tank in a detachable manner.

12. A liquid treatment apparatus treating a surface of a substrate held generally horizontally on a stage by supplying a treating liquid to said surface from a supply nozzle, comprising:

a supply tank supplying said treating liquid; and an intermediate accumulation apparatus provided in a flow path of said treating liquid from said supply tank to said supply nozzle, said intermediate accumulation apparatus comprising:

a buffer tank provided in said flow path of said treating liquid from said supply tank of said liquid to said nozzle, said buffer tank comprising:

an inlet port for introducing said treating liquid supplied from said supply tank into a buffer tank body;

a first accumulation region in said buffer tank body for holding said treating liquid introduced into said buffer tank body;

a first vent port for discharging bubbles accumulated in said first accumulation region;

a filter causing said treating liquid in said first accumulation region to pass therethrough, said filter filtering said treating liquid;

a supplying port for supplying said treating liquid filtered with said filter to said nozzle;

a gas/liquid separation part configured to separate bubbles passed through said filter from said treating liquid by using a difference of specific gravity between said treating liquid and said bubbles;

a second vent port for discharging said bubbles separated in said gas/liquid separation part; and a compartment member dividing an inner space inside said buffer tank body into said first accumulation region and further a second accumulation region, said filter being provided in a part of said compartment member so as to provide a flow path of said treating liquid from said first accumulation region to said second accumulation region; and a detection unit detecting a liquid level in said first accumulation region for notifying when said supply tank has become empty.

13. A method for supplying a treating liquid, in a liquid treatment apparatus that treats a substrate with said treating liquid by supplying said treating liquid to a surface of said substrate from a supply nozzle, such that said treating liquid is supplied from a supply tank to said supply nozzle, comprising the steps of:

introducing said treating liquid from said supply tank into a buffer tank body;

holding said treating liquid introduced into said buffer tank in a first accumulation region inside said buffer tank body;

discharging bubbles accumulated in said first accumulation region via a first vent port;

filtering said treating liquid in said first accumulation region by a filter;

supplying said treating liquid filtered with said filter to said nozzle from a supplying port and monitoring whether or not said liquid level in said buffer tank has reached a lower limit level for stopping supply of said treating liquid to said supply nozzle, said lower limit level being set above a level of said filter in said first accumulation region.

14. The method as claimed in claim 13, further comprising, before said step of supplying said treating liquid from said supply port to said supply nozzle, the steps of:

causing to flow said treating liquid filtered with said filter to a second accumulation region, said second accumulation region being provided in said buffer tank body with separation from said first accumulation region by a compartment member;

separating bubbles passed through said filter with a gas-liquid separation part provided in said second accumulation region by using a difference of specific gravity between said treating liquid and said bubbles; and discharging said bubbles from a second vent port provided in said second accumulation region.

15. The method of supplying a treating liquid as claimed in claim 13, further comprising a step of notifying that said supply tank has become empty by detecting a liquid level in said first accumulation region when replacing said supply tank.

* * * * *